United States Patent [19]

Takamatsu et al.

[11] 4,333,005
[45] Jun. 1, 1982

[54] AUTOMATIC CODE READING DEVICES

[75] Inventors: Shunichi Takamatsu; Kinshi Maekawa, both of Osaka, Japan

[73] Assignee: Itoki Co., Ltd., Osaka, Japan

[21] Appl. No.: 92,754

[22] Filed: Nov. 9, 1979

[30] Foreign Application Priority Data

Nov. 10, 1978 [JP] Japan .................................. 53-137779
Nov. 10, 1978 [JP] Japan .................................. 53-137780

[51] Int. Cl.³ ............................................ G06K 7/015
[52] U.S. Cl. ...................................... 235/435; 235/449; 235/450; 235/464
[58] Field of Search ................. 235/435, 449, 450, 464

[56] References Cited

U.S. PATENT DOCUMENTS

| | | | |
|---|---|---|---|
| 3,562,727 | 2/1971 | Abbott et al. | 235/449 |
| 3,581,064 | 5/1971 | Palmer | 235/449 |
| 3,923,158 | 12/1975 | Fornåå | 235/464 |
| 3,991,883 | 11/1976 | Hobler et al. | 235/464 |

*Primary Examiner*—Harold I. Pitts
*Attorney, Agent, or Firm*—Hopgood, Calimafde, Kalil, Blaustein & Judlowe

[57] ABSTRACT

An automatic code reading device, which is adaptable to use in object storage and retrieval apparatus, can read out the code mark affixed on an axial end surface of an object having a circular section. The device includes a housing defining a chamber in which the object should be loaded. In the housing, a read head unit for reading out the code mark and a holder for holding the drawn object are mounted. The read head unit or the holder is rotated by motor drive to scan the code mark affixed on the drawn object by the read head unit. The rotational angular extent is controlled ($360° + \alpha°$), where $\alpha°$ is at least an angular extent over which the code mark extends.

The reading device is provided with a pick-up device for drawing object into the chamber and pushing out the object therefrom.

32 Claims, 22 Drawing Figures

AUTOMATIC CODE READING DEVICES

BACKGROUND OF THE INVENTION

This invention relates to object handling devices wherein objects such as magnetic tapes, documents, books, mechanical or electrical parts and others are automatically handled, for example, automatically storaged, and retrieved, automatically selected, automatically identified or so on and, in particular, to a code mark reading devices used in such object handling devices.

Automatic object storage and retrieval apparatus have been known in the prior art, as disclosed in U.S. Pat. No. 3,526,326 and others.

The apparatus of this type generally comprises at least one object transferring device to transfer the object to a desired storage location, means for detecting instant positions of the object transferring device, means for inputting an information of the desired storage location and control means for controlling the movement of the object transferring device comparing the instant position and the input information.

In many apparatus known in the prior art, the object transferring device is provided with an extractor or pick-up device for extracting or drawing the object to the object transferring device and discharging or pushing out object therefrom.

In U.S. Pat. No. 3,526,326, such an object transferring device comprises a horizontally moved carriage and a platform vertically moving on the carriage. The carriage and platform are provided with scanners or read heads for reading out horizontally and vertically arranged code marks identifying respective storage locations. The signals read out by the read heads are compared with an address code signals input by, for example, a keyboard, and the carriage and platform are moved until both signals are consisted with one another. The platform is also provided with an extractor for extracting an object into the platform from a storage location and returning an object into a storage location from the platform.

There have been known other various arrangement of the object transferring device and various control systems for the controlled movement of the device.

In those known storage and retrieval apparatus, when the electric power supply is interrupted in the way of the storage operation, the apparatus cannot continue further operation even after the electric power supply is recovered because the input information is vanished by the interruption of the power supply.

It results to high cost of the device to use a memory in the control circuit which maintains the memorized contents even if the power supply is interrupted.

It is desired that even if the power supply is interrupted, the storaging operation is continued after the recovery of power supply, without the use of such as a memory of the higher cost.

It has been known in the prior art to affix code marks on objects to identify respective objects. For example, bar codes are deposited on a surface of objects, and they are read out by use of light pens. Automatic devices of various types for reading out bar codes are also known in prior arts. But, it has been impossible in known automatic code reading devices to read out without failure a code mark on an axial end surface of an object having a circular section, or a circular plate body, a cylindrical body or the like, such as a magnetic tape holder or case, because the object cannot be always oriented so that the code mark is registered to read heads of the device.

SUMMARY OF THE INVENTION

It is an object of this invention to provide an object storage and retrieval device wherein object transferring means is provided with means for reading out a code mark affixed on the object which is taken into the transferring means, in order to enable the further storage operation after the recovery of the power supply even if the power supply is interrupted.

It is another object of this invention to provide an automatic reading device for reading out a code mark affixed on an axial end surface of an object having a circular section.

It is still another object of this invention to provide an automatic reading device for reading out a code mark affixed on an axial end surface of an object having a circular section, which is provided with means for automatically extracting and discharging the object.

It is yet another object of this invention to provide an automatic reading device for reading out a code mark affixed on an axial end surface of an object having a circular section, wherein a read head unit is rotated in relation to the object to read out the code mark without failure.

It is a further object of this invention to provide an automatic reading device for reading out a code mark affixed on an axial end surface of an object having a circular section, wherein the object is rotated in relation to a read head unit to read out the code mark without failure.

It is a specific object of this invention to provide an automatic reading device for reading out a code mark affixed on an axial end surface of an object having a circular section, which is adaptable to use as an object transferring means in an object storage It is a still further object to realize above objects with a simple construction and a low cost.

According to an aspect of this invention, the object transferring device used in object storge and retrieval apparatus comprises an automatic code mark reading device is obtained which comprises means for reading out a code mark affixed on an object disposed in the device and means for moving one of the object and the reading means to scan the code mark by the reading means.

According to another aspect of this invention, an automatic code reading device is obtained which can read out the code mark affixed on an axial end surface of an object having a circular section. The device comprises a housing defining a chamber in which an object should be loaded. Reading means or read head means is mounted in the chamber. The housing is provided with means for holding the loaded object and with means for rotating one of the held object and the reading means to scan the code mark. The rotating means is controlled so that the rotational angular extent is $(360° + \alpha°)$, where $\alpha°$ is at least an angular extent over which the code mark extends, in order to read out the code mark without failure.

Further objects, features and other aspects will be understood from the following detailed description of preferred embodiments of this invention referring to the annexed drawings.

DETAILED DESCRIPTION OF PREFERRED EMBODIMENTS

Briefly stated, this invention is directed to a code mark reading device which comprises a housing for loading an object having a code mark to be read out, means for reading out the code mark mounted on the housing and means for moving one of the reading means and the object to scan the code mark by the reading means. The device can be also used for the object transferring device in object storage and retrievel apparatus.

Preferred embodiments of this invention will be detailed described in relation to reading devices which are adaptable to read out the code mark affixed onto the axial end surface of an object having a circular section, for example, a magnetic tape holder (which will be referred to a magnetic tape).

Referring to FIGS. 1a–3a, a code reading apparatus of an embodiment according to this invention comprises a housing 1 defining a chamber 101, a pick-up device 2 for drawing an object, or a magnetic tape MT into the chamber 101, and a scanning device 3 for scanning and reading out code mark affixed on an axial end surface of the magnetic tape MT.

Figure 1A:
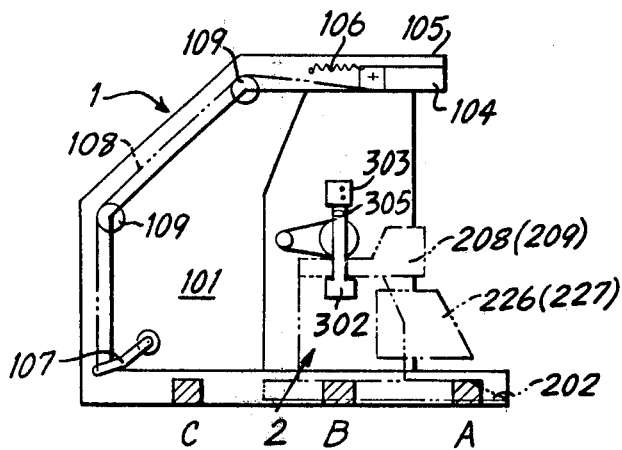
FIGS. 1a, 2a and 3a are side views illustrating different operating states of an embodiment of this invention.
Figure 2A:
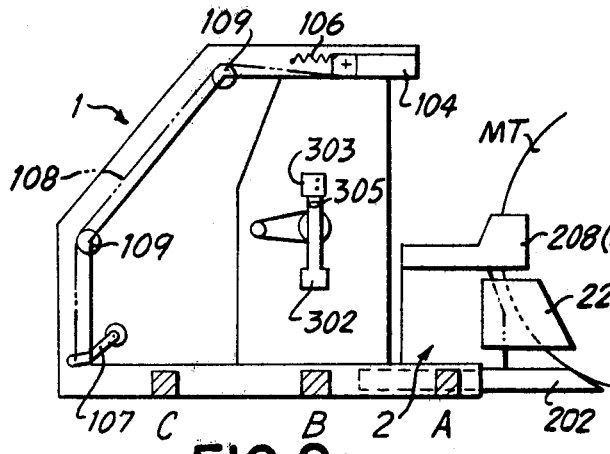
Figure 3A:
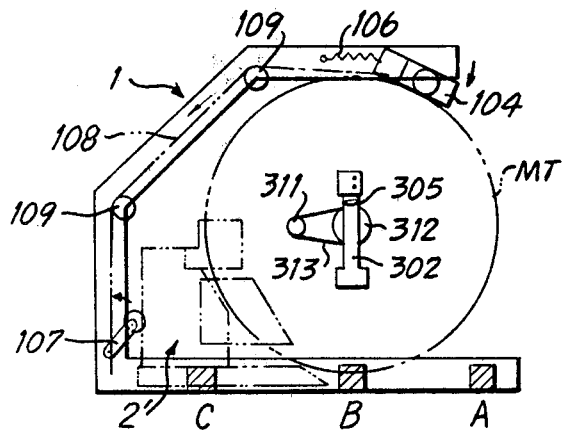
Figure 3B:
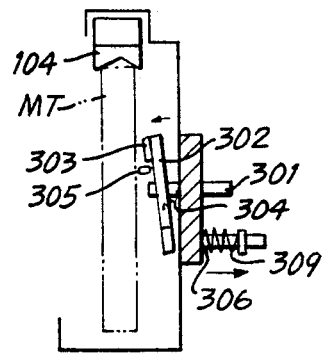

The housing 1 is open at an end, through which the magnetic tape MT is put into, or taken out of, the chamber 101. The pick-up device 2 is mounted on the bottom plate 102 of the housing 1 and is reciprocated mounted between the open end and the opposite end by drive means (not shown) to draw into and push out magnetic tape MT, as shown in FIGS. 1a, 2a and 3a. The pick-up device is employed which is proposed by one of inventors of this invention, TAKAMATSU, and which is disclosed in Japanese Utility Model Application No. 11,631/1978 filed on Feb. 3, 1978.

Figure 4:
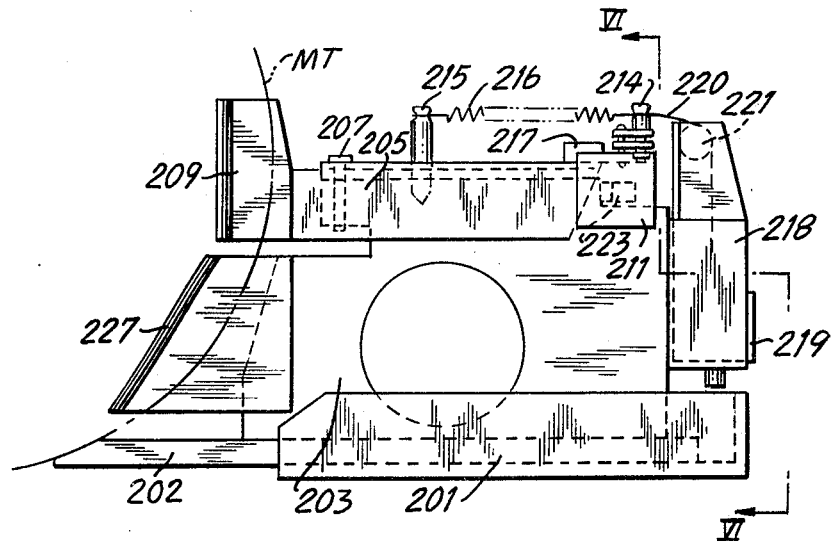
FIG. 4 is a side view of an example of a pick-up device which is used in the embodiment of this invention.
Figure 5:
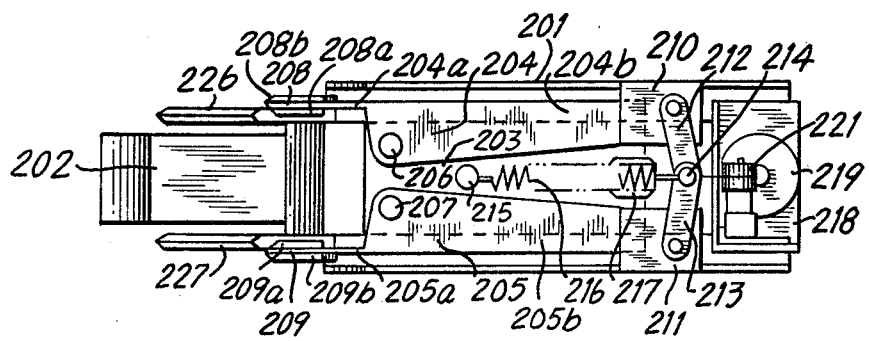
FIG. 5 is a plan view of the pick-up device.
Figure 6:
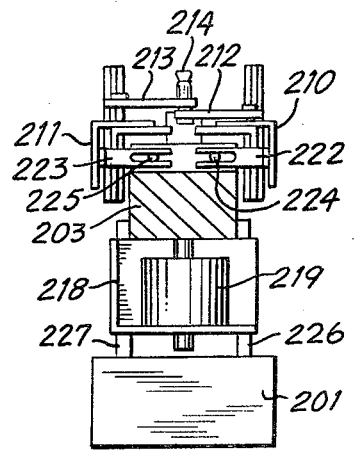
FIG. 6 is a sectional view taken along a line VI—VI in FIG. 4.

Referring to FIGS. 4–6, the pick-up device comprises a base plate 201, an arm 202 forwardly projecting from the base plate 201 and a block member 203 mounted on the base plate 201. On the block member 203, a pair of levers 204 and 205 are pivotally mounted by a pair of pins 206 and 207 so that those levers are rotatable in a horizontal plane.

Each lever of 204 and 205 comprises a vertical plate portion 204a and 205a and a horizontal plate portion 204b and 205b. Those horizontal plate portions 204b and 205b are pivotally fixed on the block member 203 by pins 206 and 207. Those vertical plate portions 204a and 205a are enlarged at the forward ends to form wing portions 208 and 209. It is desired that friction plates 208a and 209a are secured on confronting surfaces of the wing portions 208 and 209. Reinforcing plates 208b and 209b are also desired to be secured on opposite surfaces of the wing portions 208 and 209. Each wing portion is formed in an edge shape at the forward end, as shown in FIG. 5.

A pair of L-shaped fittings 210 and 211 are affixed to the rear ends of levers 204 and 205, and are connected with one another by a pair of links 212 and 213. Namely, an end of the link 212 is pivoted to the horizontal plate portion of the L-shaped fitting 210 by pin means, with the other end being pivoted to an end of the other link 213 by pin means 214. The other end of the link 213 is also pivoted to the horizontal plate portion of the other L-shaped fitting 211.

A coil spring 216 is tensed between the pin 214 and a fixed pin 215 which is fixedly mounted on the block member 203, so that levers 204 and 205 are urged to open at the forward ends. A stopper 217 is also fixedly mounted on the block member 203 to prevent the connecting pin 214 from forwardly moving therefrom by the tension of the coil spring 216. Therefore, when the connecting pin 214 is urged to the stopper 217 by the tension of coil spring 216, the distance between the pair of wing portions 208 and 209 is minimum. The distance should be designated shorter than the axial dimension of the magnetic tape MT.

A bracket 218 is secured on the rear end surface of the block member 203, on which an electromagnetic solenoid and plunger unit 219 is mounted. Plunger of the solenoid and plunger unit 219 is connected to the connecting pin 214 by a cable or wire 220 which is guided by a pulley 221. When the solenoid and plunger unit 219 is energized, connecting pin 214 is pulled by the plunger against the tension of coil spring 216, so that L-shaped fittings 210 and 211 come to one another while wing portions 208 and 209 going away from one another. In order to prevent wing portions from excessively going away, stopper means 222–225 are disposed between L-shaped fittings 210 and 211 to limit the movement of the L-shaped fittings. Namely, stopper plates 222 and 223 are fixed onto the block member 203 by screws 224 and 225. The stopper plates are formed with slots through which screws 224 and 225 extend. Thus, the limit of the movement of each L-shaped fitting is adjustable.

A pair of guide plates 226 and 227 are fixedly mounted on both side surfaces at the forward end of block member 203. The guide plates 226 and 227 forwardly extend beyond the wing portions 208 and 209. These guide plates have knife-edge ends which are inclined so that the lower end extends beyond the top end. The distance between both guide plates 226 and 227 is determined slightly larger than the thickness of the magnetic tape MT.

When pick-up device 2 moves to the open end of the housing 1, as shown in FIG. 2, magnetic tape MT on a shelf (not shown) is raised by the taperred end of the arm 202 and is held by wing portions 208 and 209. Thus, the magnetic tape MT is picked up and is drawn into the chamber 101 by the retraction of the pick-up device 2, as shown in FIG. 3.

The scanning device 3 for reading out a code mark on magnetic tape MT drawn into the chamber 101 is mounted on a side plate 103 of the housing 1.

Referring to FIGS. 7-10 in addition to FIGS. 1a-3b, a shaft 301 is rotatably supported in the side plate 103. A lever 302 is pivoted on the inner end of the shaft 301. A read head unit 303 is mounted on an end of the lever 302, and the other end of the lever 302 is connected to the shaft 301 by a tension spring 304 to urge the read head unit 303 inside the chamber 101.

A roller 305 is mounted on the lever 302 near the read head unit 303 and inwardly projects beyond the read head unit 303, so that the gap between the read head unit 303 and the axial end surface of magnetic tape MT drawn into the chamber is maintained constant.

A push rod 306 is so mounted on the side plate 103 that the end of the push rod is against the end of the lever 302 opposite to the read head unit 303 at the initial position of the rotation of the shaft 301. The push rod 306 is connected with a plunger of an electromagnetic solenoid and plunger unit 307 through a lever 308. A compressed coil spring 309 is disposed on the push rod 306 to impart the push rod from the lever 302. When the solenoid and plunger unit 307 is energized, the push rod 306 is moved into the chamber 101 to push the end of the lever 302 against the tension spring 304. Therefore, the read head unit 303 and roller 305 retract, so that magnetic tape MT may be readily drawn into, and pushed out of, the chamber 101.

An electric motor 310 is mounted on the side plate 103, on an output shaft of which a pulley 311 is mounted. Another pulley 312 is mounted on the shaft 301, and an endless belt 313 is stretched between pulleys 311 and 312 to transmit the motor output to the shaft 301.

Referring to FIGS. 1a-3b again, a holding plate 104 is pivoted in the ceiling member 105 of the housing 1 to pivotally lower to hold the magnetic tape MT drawn into the chamber 101 stationary. The holding plate 104 is urged by a tension spring 106 to be raised. While, a lever 107 is disposed in the chamber 101 to be engaged with the most retracted pick-up device 2. The lever 107 is connected with the holding plate 104 by a chain or cable 108 guided by pulleys 109. Thus, when the pick-up device 2 retracts and engages with the lever 107, the holding plate 104 is lowered against the tension spring 106, and holds the drawn magnetic tape MT stationary. Reference characters A, B, and C represent microswitches for detecting the instant position of the pick-up device 2.

Figure 1B:
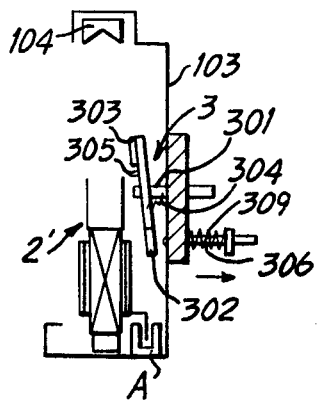
FIGS. 1b, 2b and 3b are front views of the embodiment, corresponding to FIGS. 1a, 2a and 3a, respectively.
Figure 2B:
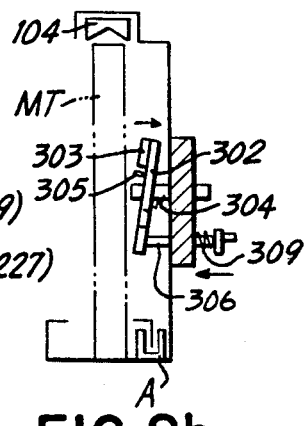

In operation, pick-up device 2 moves from the initial position as shown in FIGS. 1a and 1b to the pick-up position as shown in FIGS. 2a and 2b where magnetic tape MT is picked up by the pick-up device 2. The taperred end of the arm 202 goes between the magnetic tape MT and the shelf to raise the magnetic tape MT. Guide plates 226 and 227 go in the both sides of magnetic tape MT to prevent the magnetic tape MT from falling down. When the pick-up device 2 arrives the forward end, microswitch A is activated, and, thus, the energization of the solenoid and plunger unit 219 of the pick-up device 2 is broken off so that wing portions hold the magnetic tape MT therebetween by the tension of the spring 216.

The signal of the activated microswitch A is also used for retracting the pick-up device 2 and for activating the solenoid and plunger unit 307. The energization of the solenoid and plunger unit 307 causes the push rod 306 to push the lever 302, so that the read head unit 303 and roller 305 are retracted. Accordingly, the pick-up device 2 is permitted to retract to the most retracted position with holding the magnetic tape MT.

When the pick-up device 2 retracts to the most retracted position, the pick-up device 2 engages with the lever 107, which, in turn, pulls the cable 108, so that the holding plate 104 is lowered to hold the magnetic tape MT stationary. At a time, pick-up device 2 activates the microswitch C, and the signal from the activated microswitch C is used for stopping the pick-up device 2 and for blocking off the energization of the solenoid and plunger unit 307. Accordingly, the lever 302 rotates by the tension spring 304 so that the roller 305 is pressed onto the axial end surface of the drawn magnetic tape MT with the read head unit 303 facing the axial end surface of the magnetic tape MT with a constant gap therebetween. In this condition, when the motor 310 is driven to rotate the shaft 301, the read head unit 303 scans the axial end surface of the magnetic tape MT.

Therefore, even if the code mark is affixed at any angular position on the axial end surface of the magnetic tape MT, it can be read out without failure by scan of the read head unit 303. It will be noted that the central axis of the shaft 301 should be consisted with the center of the drawn magnetic tape MT held by the retracted pick-up device 2.

An angular extent of rotation of the read head unit 303 for scanning should be determined sufficient to read out the code mark affixed onto the axial end surface of the magnetic tape MT.

Figure 11:
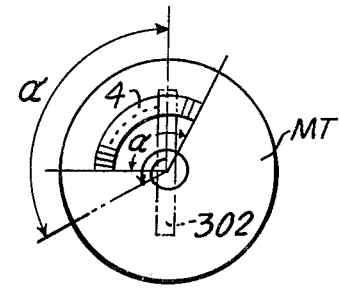
FIG. 11 is a view for explaining a rotational angular extent for scanning.

Referring to FIG. 11, if the code mark 4 extends over $\alpha°$ (for example, $\alpha° = 120°$), it is secured by the rotation of the read head unit 303 over $(360° + \alpha°)$ to read out the code mark 4, even if the code mark 4 is positioned at any angular position in relation to the intitial position of the read head unit 303. Therefore, the motor 310 should be controlled to rotate the read head unit 303 over at least $(360° + \alpha°)$. This control can be achieved by the use of a timer, taking the rotation speed of the motor into the consideration. But, in the instant embodiment, sensing means for sensing the angular position of the shaft 301 are provided for the control.

Figure 7:
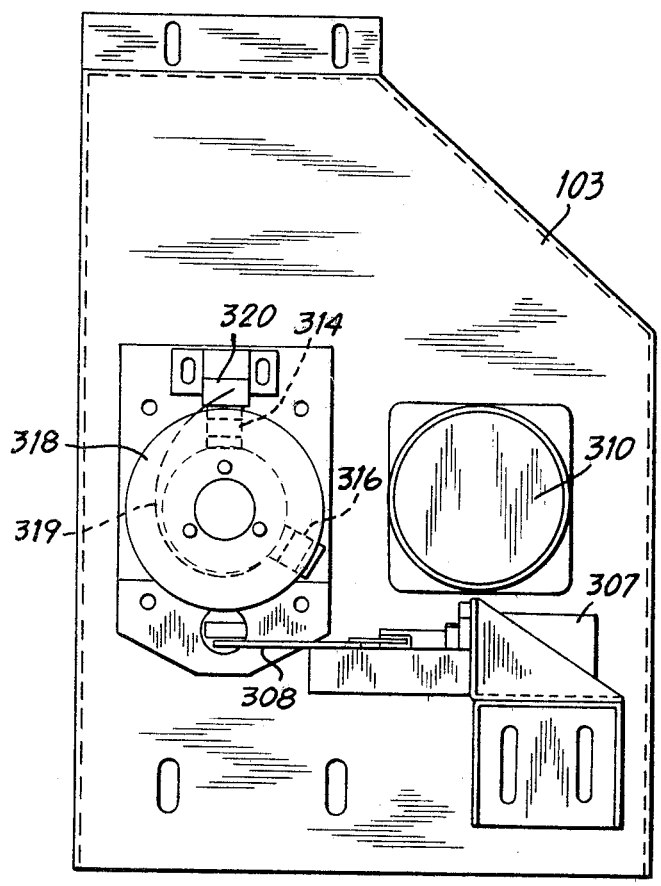
FIGS. 7–10 are views for illustrating a scanning device in the embodiment in FIGS. 1a–3b, FIG. 7 being an outer side view, FIG. 8 being an inner side view, FIG. 9 being a front view, and FIG. 10 being a fragmentary disassembled view.
Figure 8:
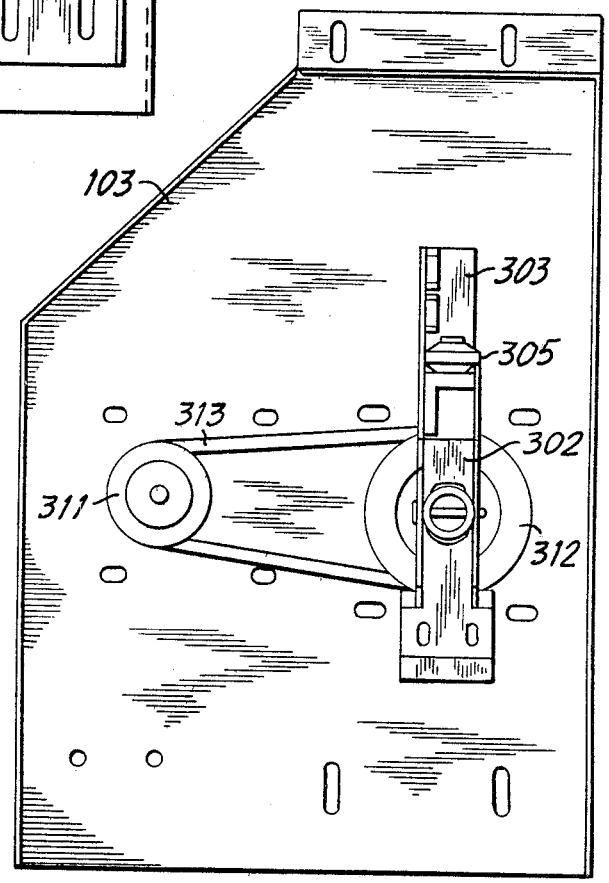
Figure 9:
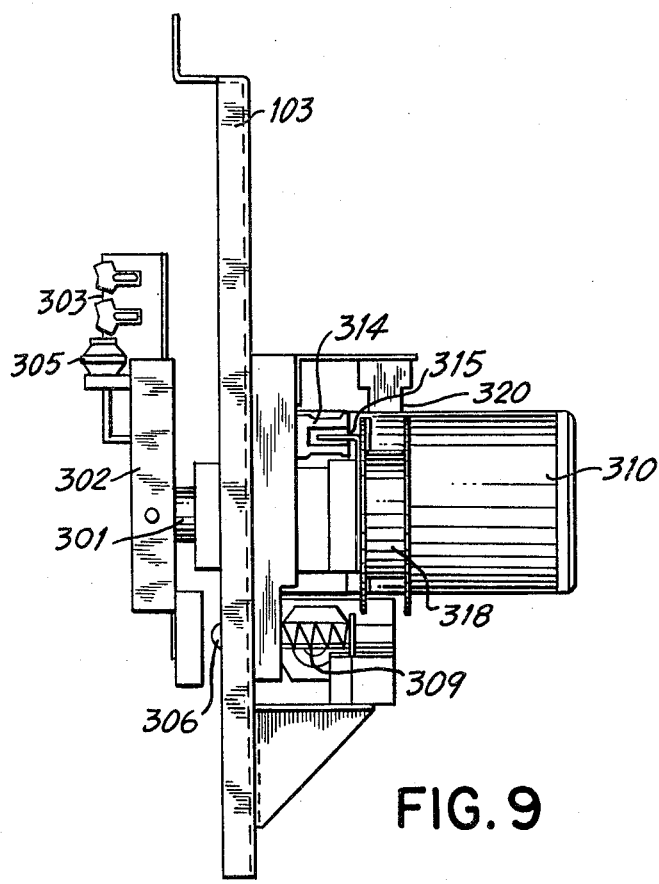
Figure 10:
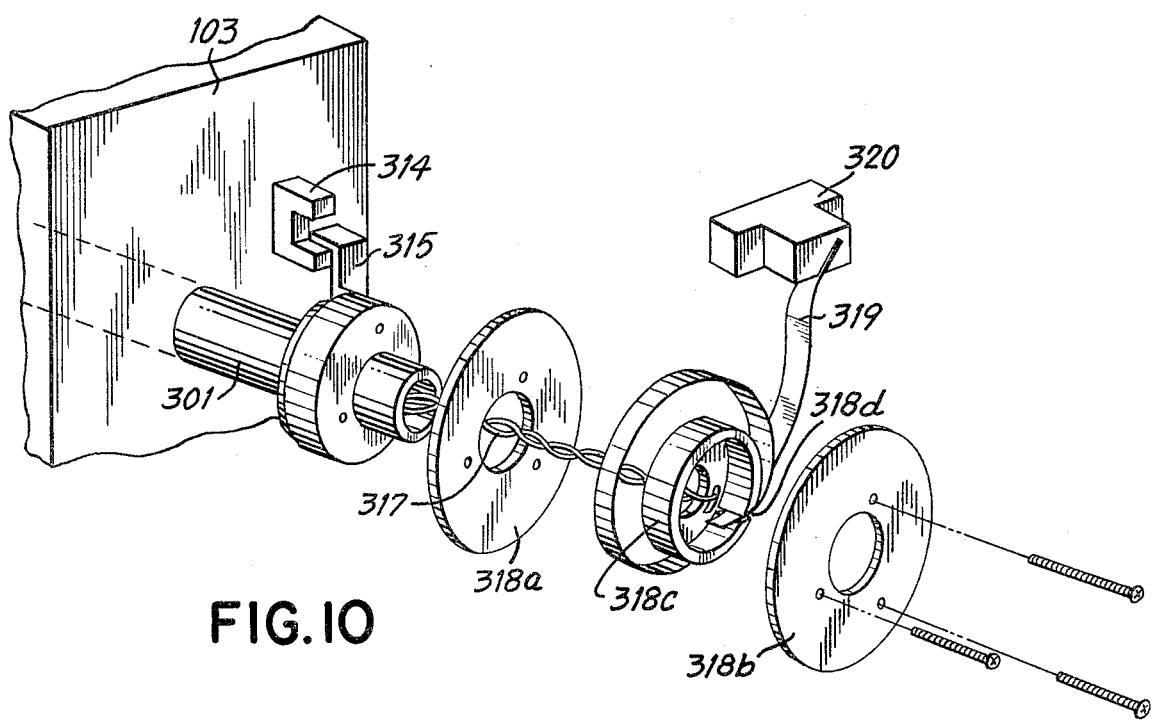

Referring to FIGS. 7, 9 and 10, a photo-switch unit 314 comprising a light source and a photo-cell is mounted on the side plate 103 near the shaft 301. A shutter plate 315 is mounted on the shaft 301 to cross between the light source and the photo-cell once at a revolution of the shaft 301. Angular positions of photo-switch 314 and shutter plate 315 are so determined that the shutter plate interrupts between the light source and the photo-cell at a time when the read head unit 303 is at the initial position.

Another photo-switch unit 316 is mounted on the side plate 103 at the angular position spaced from the photo-switch unit 314 by $\alpha°$ in the direction of the rotation of the shaft 301, and is interrupted by the shutter plate 315 once at a revolution of the shaft.

Therefore, when the read head unit 303 rotates over the angular of (360°+α°) after the motor 310 starts, the photo-switch 316 generates twice off-signal. The rotation of motor 310 is reversed by the use of the second off-signal, and, thereafter, is stopped by the use of the off-signal from the photo-switch 314. Thus, the read head unit 303 is restored to the initial position, after scanning over the angular extent of (360°+α°). Therefore, it is secured to read out the code mark affixed on the axial end surface of the magnetic tape MT.

Figure 12:
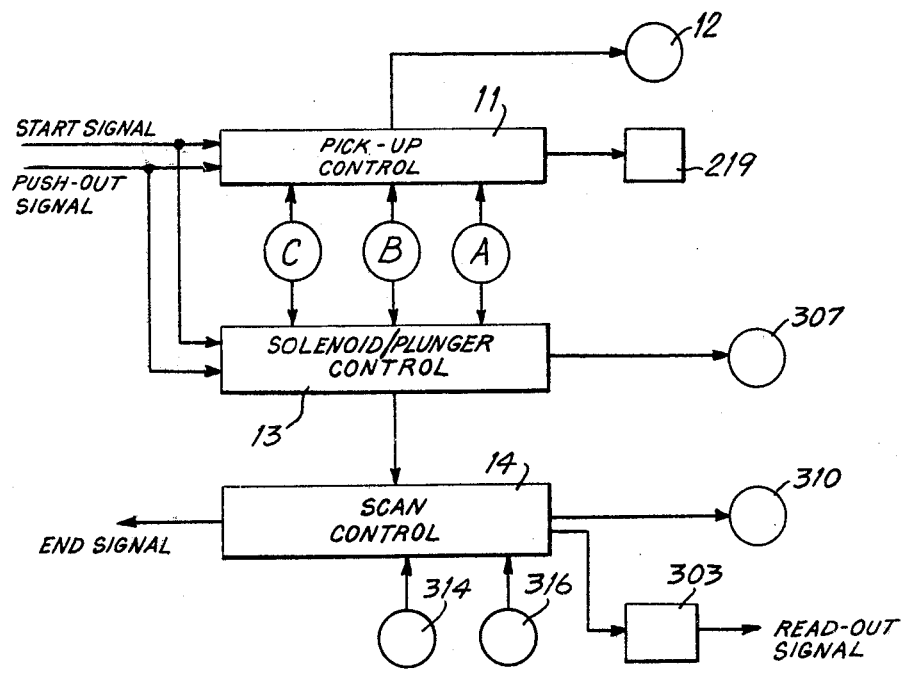
FIG. 12 is a block diagram of a control circuit of the embodiment of FIGS. 1a–11.

A control circuit for controlling the operation of the embodiment in FIGS. 1a–11 is shown in FIG. 12.

Referring to FIG. 12, a circuit block 11 is a circuit for controlling the pick-up device 2, namely, the solenoid and plunger unit 219 and a motor 12 for moving the pick-up device 2. The pick-up controlling circuit 11 is coupled with microswitch units A, B and C. To the pick-up controlling circuit 11, a start signal from, for example, a manual starter (not shown), and a push-out signal from, for example, another manual switch (not shown) or a scan control circuit 14 are input.

When the start signal is input at a time when the microswitch B is actuated, the pick-up control circuit 11 drives the motor 12 to move the pick-up device towards the open end of the housing 1, and also energizes the solenoid and plunger unit 219 to open the wing portions 208–209. Thereafter, when the microswitch A is actuated, the control circuit 11 breaks off the energization of solenoid and plunger unit 219 and reverses the rotation of the motor 12. Then, when the microswitch C is actuated, the control circuit 11 stops the motor 12. Thus, the magnetic tape MT is drawn into the chamber 101, as shown in FIG. 3a. In this state, when the push-out signal is applied, the control circuit 11 again drives motor 12 to move the pick-up device 2 to the open end of the housing 1. When microswitch A is, then, actuated, the control circuit 11 energizes the solenoid and plunger unit 219 and reverses the rotation of the motor 12. Thereafter, the control circuit 11 stops the motor 12 at a time when the microswitch B is actuated. Then, the control circuit is under its ready condition, and the pick-up device 2 is restored to the ready condition as shown in FIG. 1a.

A circuit block 13 is a circuit for controlling the operation of the solenoid and plunger unit 307. The solenoid and plunger control circuit 13 is also coupled with microswitches A, B and C and is also applied the start signal and the push-out signal.

After the start signal is input at a time when the microswitch B is actuated, the circuit 13 energizes the solenoid and plunger unit 307 at a time when the microswitch A is actuated. The circuit may be designated to energize the solenoid and plunger unit 307 at a time when the start signal is input while the microswitch B is actuated. Thereafter, when the microswitch C is actuated, the control circuit 13 breaks off the energization of the solenoid and plunger unit 307 and outputs a scan starting signal. In this state, when the push-out signal is input, the control circuit 13 again energizes the solenoid and plunger unit 307, and, thereafter, breaks off the energization at a time when microswitches B and A are actuated in the order of B, A and B. Thus, the control circuit is restored to the initial ready condition.

A circuit block 14 is a circuit for controlling the scanning device, which is coupled with the photo-switches 314 and 316. When the scan starting signal is applied from the solenoid and plunger control circuit 13, the control circuit 14 drives the scanning motor 310 and actuates the read head unit 303. When an off-signal is twice input from the photoswitch 316, the control circuit 14 reverses the rotation of the motor 310. Thereafter, when an off-signal is input from the photoswitch 314, the control circuit 14 stops the motor 310 and the reading operation of the read head unit 303. At a time, the control circuit 14 outputs an end signal for indicating the completion of reading operation. The end signal is utilized as the push-out signal and/or an actuating signal for an indicator.

During the scan of the read head unit 303, the code mark is read out by the read head unit 303, from which read out signal is output.

In the above embodiment, since the read head unit 303 is rotated for scanning, the cables must be movable to follow the read head unit 303. To this end, lever 302 and shaft 301 are hollow for leading the cables 317 therethrough, as shown in FIG. 10. Shaft 301 is provided with a cord reel 318 mounted on an outer end of the shaft. The cord reel 318 comprises a pair of opposite end plates 318a and 318b and a cylindrical body 318c connected between both end plates 318a and 318b. The cylindrical body 318c is formed with a slit 318d, through which the cables 317 are led out of the cylindrical body 318c. The cables 318 are connected to a flat cable 319 which is loosely wound on the reel 318, and the outer end of the flat cable 319 is connected to an electrical connector 320 which is fixedly mounted on the side plate 103 of the housing 1.

In this arrangement, cables 317 do not hang down but follows the movement of the read head unit 303. Moreover, the twist of cables 317 may be temporarily caused due to the rotation of the read head unit 303, but it is suppressed by elasticity of the wound flat cable 319, so that the break of cables due to the twist may not be caused.

In the above mentioned embodiment as shown in FIGS. 1a–12, read head unit 303 is rotated for scanning the code mark on the magnetic tape MT. But, it is also possible to read out the code by rotating the magnetic tape MT in place of the read head unit. Two embodiments in which magnetic tape MT is rotated will be described hereinafter.

Figure 13:
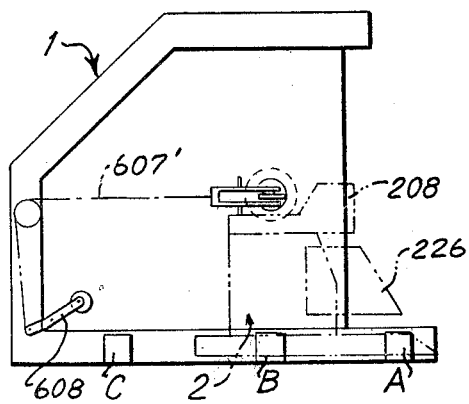
FIG. 13 is a schematic side view of another embodiment.
Figure 14:
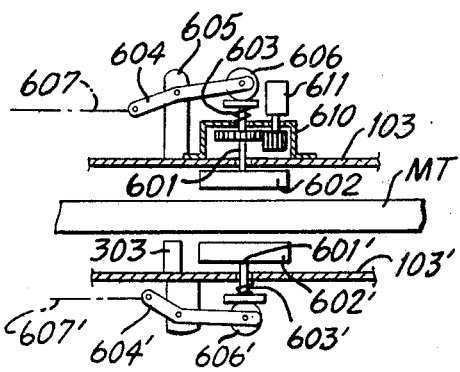
FIG. 14 is a view for illustrating an arrangement of a scanning device in the embodiment of FIG. 13.

Referring to FIGS. 13 and 14, the embodiment shown comprises a housing 1 and a pick-up device 2 similar to the previous embodiment in FIGS. 1a–6. Read head unit 303 is fixedly mounted on the inner surface of the side plate 103' to face a magnetic tape MT drawn into the chamber 101 by the pick-up device 2.

A device for holding and rotating the drawn magnetic tape MT comprises a pair of shafts 601 and 601' which are rotatably mounted on and through side plates 103 and 103' of the housing 1. Circular plates 602 and 602' are respectively mounted on inner ends of the shafts. The shafts 601 and 601' are urged by compressed coil springs 603 and 603' outwardly. Levers 604 and 604' are pivoted to brackets 605 and 605' secured on outside surfaces of respective side plates 103 and 103'. The levers 604 and 604' have rollers 606 and 606' rotatably supported on respective one ends, which engage with outer ends of respective shafts 601 and 601'. The other ends of respective levers 604 and 604' are connected through chains or cables 607 and 607' with a lever 608 which is mounted in the housing 1 to engage with most retired pick-up device 2, similar to lever 107 in the previous embodiment shown in FIG. 1a. Accordingly, when the pick-up device 2 moves to the most retracted position to actuate the lever 608, levers 604 and 604' are so actuated that rollers 606 and 606' push shafts 601 and 601' into chamber 101. Therefore, circular plates 602 and 602' are pushed onto opposite surfaces of magnetic tape MT drawn in the chamber 101, to hold the magnetic tape MT. It will be noted that shafts should be consisted with the axis of the magnetic tape MT held by the most retracted pick-up device 2.

On shaft 601, a gear 609 is mounted. The gear 609 engages with a gear 610 mounted on an output shaft of a motor 611 which is mounted on the side plate 103. Accordingly, the magnetic tape MT held by the circular plates 602 and 602' is rotated by the operation of the motor 611.

Figure 15:
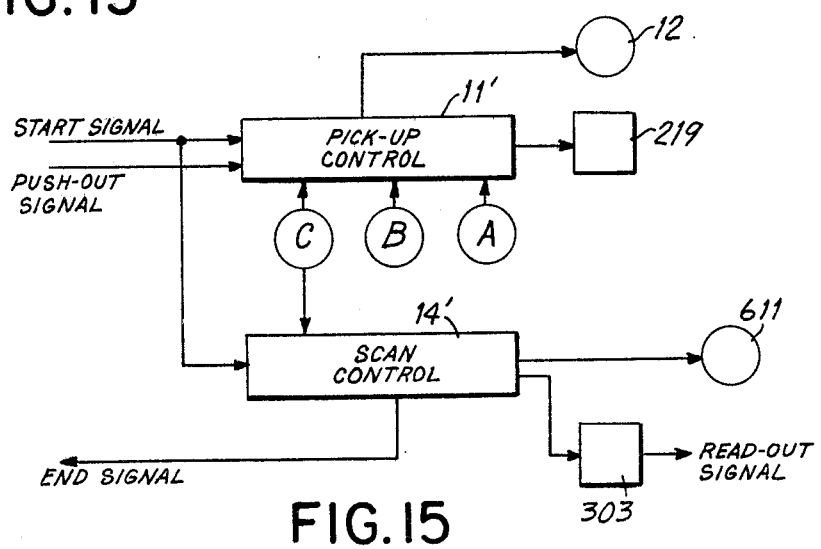
FIG. 15 is block diagram of a control circuit of the embodiment of FIGS. 13 and 14.

The operation of this embodiment will be described referring to a control circuit as shown in FIG. 15.

The operation of pick-up device 2 is similar to that of the previous embodiment in FIGS. 1a–3b, except that wing portions 208 and 209 are open to free magnetic tape MT during a period when the reading operation is performed by read head unit 303, to permit the magnetic tape MT to be rotated. Therefore, pick-up control circuit 11' is similar to pick-up control circuit 11 in FIG. 12, except that the circuit 11' energizes solenoid and plunger unit 219 during a time period from the actuation of the microswitch C to the presence of the push-out signal. Therefore, magnetic tape drawn into chamber 101 by pick-up device 2 is held by circular plates 602 and 602' during a time period when the pick-up device 2 is at the most retracted position.

A scanning control circuit 14' is for controlling motor 611 and read head unit 303, and starts motor 310 and read head unit 303 at a time when an on-signal is input from microswitch C. Accordingly, the magnetic tape MT is rotated and, during the rotation, the read head unit 303 reads the code marks.

In the arrangement of this embodiment, since read head unit 303 is fixedly disposed, the code mark is read out without failure merely by rotating the magnetic tape MT over an angular extent of $(360° + α°)$. It is not necessary to restore the magnetic tape MT to the initial angular position. Therefore, the scanning control circuit 14' controls motor 611 and read head unit 303 to stop after a predetermined time period from the start, and outputs the end signal which is used as the push-out signal similar to that of the previous embodiment. The time period is determined a time period during which the magnetic tape MT is rotated by the motor 611 over angular extent of $(360° + α°)$.

When the push-out signal is applied to the pick-up control circuit 11', the circuit 11' breaks off the energization of solenoid and plunger unit 219 and starts motor 12. Accordingly, the pick-up device 2 is moved to open end of the housing 1. Thus, the magnetic tape MT is pushed out from the housing 1, and the pick-up device 2 is retracted to the initial position similar to the previous embodiment.

It will be noted that the lever 608 actuated by the pick-up device 2 may be replaced by a solenoid and plunger unit which is actuated by an on-signal from the actuated microswitch C.

Figure 16:
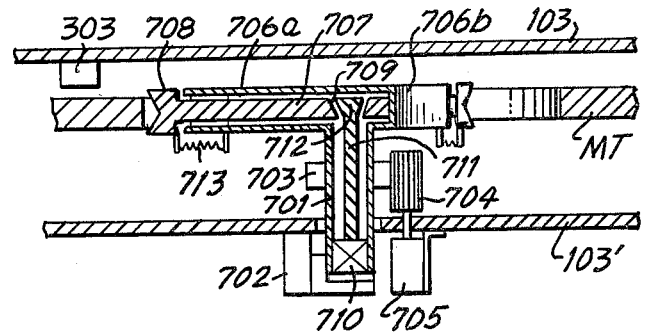
FIG. 16 is a sectional view for illustrating a main portion of still another embodiment.
Figure 17:
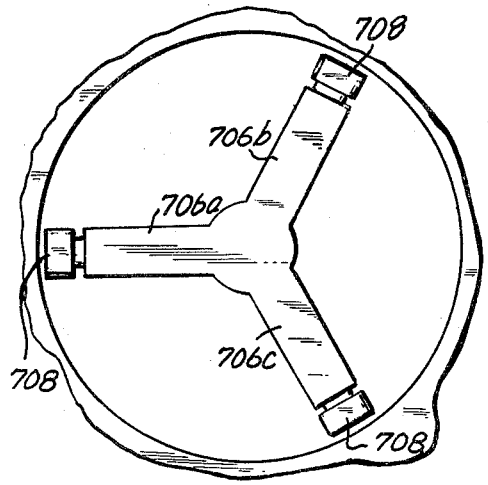
FIG. 17 is a side view of a part in the embodiment of FIG. 16.
Figure 18:
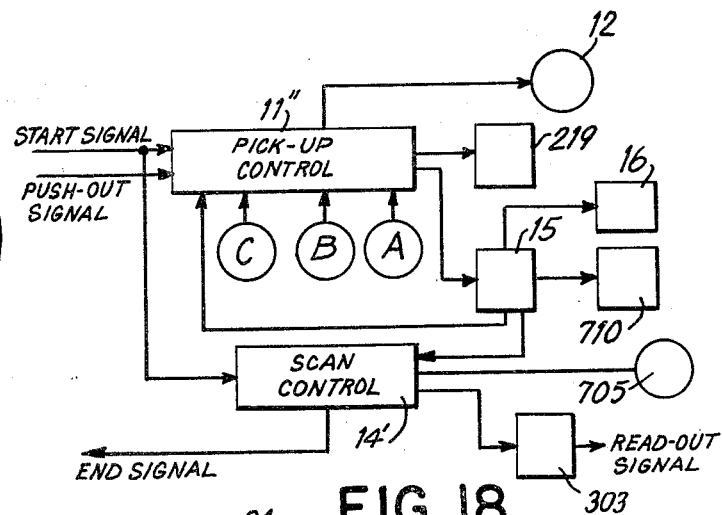
FIG. 18 is a block diagram of control circuit of the embodiment of FIGS. 16 and 17.

FIGS. 16–18 show another embodiment of an arrangement for rotating the drawn magnetic tape MT, in which a center hold of magnetic tape MT is utilized.

Referring to FIGS. 16 and 17, a hollow shaft 701 is rotatably and axially slidably supported in and through the side plate 103' of the housing 1. The outer end of the shaft 701 is rotatably coupled with an air cylinder 702 to be axially moved by the operation of the air cylinder 202.

A gear 703 is fixed mounted on the shaft 701, which gear engages with a gear 704 on an output shaft of a motor 705 fixedly mounted on the side plate 103'. Therefore, the shaft 703 is rotated by the operation of the motor 705. The hollow shaft 701 is provided with three hollow arms 706a, 706b and 706c at the inner end, which arms radially extend with an equal angular space therebetween. These hollow arms have rods 707 axially slidably supported therein, respectively. Each rod is provided with a V-block 708 at the outer end and with an inclined end surface 709 at the inner end.

In the hollow shaft 701, an electric solenoid and plunger unit 710–711 is mounted. The plunger 711 is provided with an end block 712 like a triangular pyramid, which engages with inclined end surfaces 709 of rods 707. Rods 707 are urged by tension spring 713 inwardly. Accordingly, when the plunger 711 is axially pulled by the energization of the solenoid 710, rods 707 are radially outwardly pushed due to the sliding engagement between each inclined surface 709 and outer surface of the pyramidal block 712. So that V-grooves of the V-blocks 708 engage with the edge of the central hole of the magnetic tape MT. Thus, the magnetic tape MT is supported by the rods 707.

In this state, if the motor 705 is rotated, the magnetic tape MT is rotated so that code mark can be read out by read head unit 303. When solenoid 710 is disenergized, plunger 711 is restored to the initial position by means of a tension spring (not shown). Therefore, rods 707 are also radially inwardly restored by tension springs 713 so that the magnetic tape MT is free from the support by V-blocks 708.

The operation of this embodiment will be described referring to FIG. 18. In this embodiment, pick-up device 2 is also controlled by a pick-up control circuit 11' similar to circuit 11 or 11' in previous embodiments. But, when microswitch C is actuated, the control circuit 11" does not immediately disenergize solenoid and plunger unit 219 but outputs a signal to a cylinder and solenoid control circuit 15. And, thereafter, the control circuit 11" disenergizes the solenoid and plunger unit 219 at a time when a signal is applied from the cylinder and solenoid control circuit 15.

Upon receiving the signal from the pick-up control circuit 11", the cylinder and solenoid control circuit 15 generates a driving signal to an air cylinder drive circuit 16, so that air cylinder 702 moves shaft 701 inwardly until arms 706a –706c are disposed in the central hole of the magnetic tape MT as shown in FIG. 16. Then, the control circuit 15 energizes the solenoid 710 and applies the signal to the pick-up control circuit 11" to energize solenoid plunger unit 219. When solenoid and plunger unit 219 is energized, magnetic tape MT is free from holding by wing portions, while the magnetic tape MT is supported by V-blocks 708 as above described, because the solenoid 710 is energized.

The reading control circuit 14' is similar to that in the embodiment of FIG. 15. Upon receiving a signal from the control circuit 15, the control circuit 14' drives motor 705 and starts the operation of read head unit 303. Accordingly, magnetic tape MT is rotated and read head unit 303 reads out the code mark of the magnetic tape during the time.

After the rotation of magnetic tape over the angular extent of $(360° + α°)$, the control circuit 14' stops the motor 705 and read head unit 303, and outputs the end signal.

When the pick-up control circuit 11" receives the end signal or other push-out signal from such as manual switch, it disenergizes the solenoid and plunger unit 219 so that the magnetic tape is supported by wing portions. The control circuit 11" also generates a restoring signal to the cylinder and solenoid control circuit 15. The control circuit 15 disenergizes the solenoid 710 so that the magnetic tape MT is free from support by V-blocks 708. The control circuit 15 also applies a restoring signal to the air cylinder drive circuit 16, which, in turn, drives the air cylinder 702 to restore the shaft 701 to the initial position. Then, the control circuit 15 generates a signal to the pick-up control circuit 11", which, in turn, drives motor 12 to move the pick-up device 2 towards the open end of the housing 1. The further operation of pick-up device 2 is similar to that in the embodiment in FIGS. 13–15. Thus, the magnetic tape MT is discharged from the device and the device is brought into the initial ready condition.

In any one of above mentioned embodiments, objects of a circular section, such as magnetic tapes, can be automatically drawn into, and pushed out of, the device, and code mark affixed on the axial end surface of the drawn object can be read out without failure. Therefore, it will be noted that the device is useful for identification, classification, selection and other handling of objects.

It will be readily understood by those skilled in the art that the arrangement including read head unit and means for rotating the read head unit or object can be applied to object transferring devices in storage retrieval apparatus. In that case, even if the electric power supply is interrupted to the storage operation, since a code mark on object can be automatically read out, if the code mark is affixed on the object, in the state that the object is put on the object transferring device after the power supply is recovered, the storage operation can be continued. A simple application is to use above mentioned reading devices as transferring devices.

Figure 19:
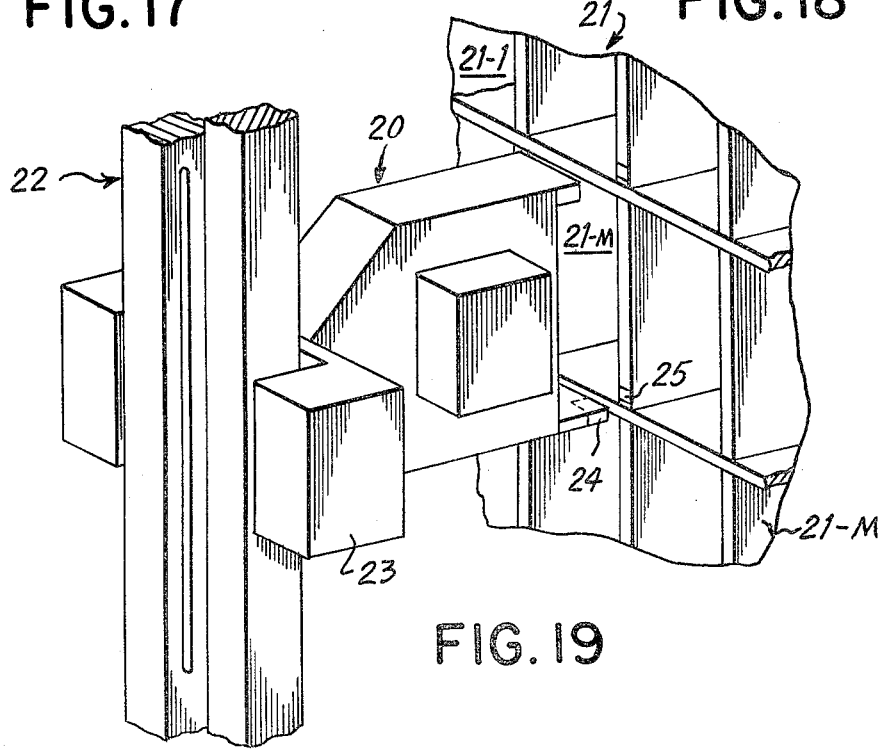
FIG. 19 is a perspective view of an object transferring device of an embodiment according to this invention.

Referring to FIG. 19, a storage retrieval apparatus includes a rack or a shelf 21 having storage locations 21-*l*, . . . , 21-*m*, . . . , 21-*n* in which objects should be storaged. A carriage 22 is disposed in front of the rack to be horizontally movable along the rack 21. On the carriage 22, a slide block 23 is vertically movably mounted. A retrieve device 20 is fixedly mounted on the slide block 23. The retrieve device 20 is arranged similar to any one of above mentioned reading device.

The horizontal movement of the carriage 22 and the vertical movement of the slide block 23 together with the retrieve device 20 are controlled by a known method in the prior art, to position the retrieve device 20 to a desired storage location. If the control method similar to that in the above mentioned U.S. Pat. No. 3,526,326, is employed, the retrieve device 20 is additionally provided with a similar scanner 24 to read out code marks 25 which are mounted on the rack 21.

It is performed by the pick-up device 2, as already described in relation to previous embodiments, to draw object from, and discharge object to, the desired storage location. The pick-up control circuit (11, 11' or 11" in FIG. 12, 15 or 18) for controlling the pick-up device is connected to, and assembled into, a main control circuit of the storage retrieval apparatus.

In the arrangement, since the code mark of the object drawn into the retrieve device can be read out after the object is drawn into chamber it can be omitted to input an address code of a storage location by keyboard at a time when an object is intended to be storaged. Furthermore, when the power supply is recovered after interrupted in the way of storage operation, the further storage operation is continued because the code mark of the object is read out.

Assuming that the reading device in FIGS. 1a–12 is used as the retrieve device 20, when the power supply is recovered, microswitch C outputs an on-signal. Therefore, the solenoid and plunger control circuit 13 outputs a scan starting signal. Accordingly, scan control circuit 14 drives the motor 310 and actuates read head unit 303. Thus, the code mark of the object on the retrieve device can be read out. The read out signal is used in the main control circuit as the address code of the storage location.

In a case when any one of the embodiments in FIGS. 13–15 and FIGS. 16–18 is used as the retrieve device 20, the storage operation is similarly continued after the power supply is recovered.

As read head unit, various read head units are employed, depending on kinds of code mark. If the code mark is a light reflective code tape, an optical read head unit is employed.

This invention has been described in detail in relation to preferred embodiments, but these are example only and this invention is not restricted to these embodiments. It will be easily understood by those skilled in the art to make various modifications and variations within the scope of this invention.

What is claimed is:

1. An automatic code reading device for reading out a code mark affixed on an axial end surface of an object having a circular section, which comprises:
   a housing defining a chamber in which the object should be loaded;
   means for stationarily holding the object within said chamber;
   means for reading out the code mark and disposed in said chamber to face the object contained in said chamber; and
   means for rotating said reading means around the axis of the object contained in said chamber to scan the code mark on the axial end surface of the object without failure, said rotating means including a shaft rotatably supported through and by said housing, motor means for rotating said shaft and mounted on said housing, a lever arm pivoted on the inner end of said shaft and having said reading means mounted on an end thereof, roller means mounted on said lever arm near said reading means, and tension spring means connected between the other end of said lever arm and said shaft to urge said roller means to the axial end surface of the object contained in said chamber.

2. The automatic code reading device as claimed in claim 1, which further comprises means for taking the object into said chamber.

3. The automatic code reading device as claimed in claim 1, which further comprises means for pushing said other end of said lever arm against said tension spring means for permitting the object to be smoothly drawn into and discharged from said chamber without the engagement with said reading means and said roller means.

4. The automatic code reading device as claimed in claim 3, which further comprises a motor control circuit for controlling said motor means to rotate said reading means over a predetermined angular extent of $(360° + \Delta°)$ and to reversely rotate, thereafter, to return said reading means to the initial angular position, where $\alpha°$ is at least an angular extent over which the code mark extends on the axial end surface of the object.

5. The automatic code reading device as claimed in claim 4, which further comprises first angular sensing means for sensing the initial angular position of said reading means, second angular sensing means for sensing a rotational angular position of $\alpha°$ of said reading means from the initial angular position, and said motor control circuit reversing the rotation of said motor means at a time when an output signal from said second angular sensing means is twice input and, thereafter, stopping said motor means at a time when an output signal from said first angular sensing means is input.

6. The automatic code reading device as claimed in claim 5, which comprises first and second photo-switch units each comprising a light source and a photo-cell and fixedly mounted on said housing, and a common shutter means secured to said shaft to cross between said light source and said photo-cell during the rotation of said shaft.

7. The automatic code reading device as claimed in claim 1, which further comprises said shaft being a hollow shaft, said lever arm being a hollow lever, cable means connected to said reading means and led out through said hollow lever and said hollow shaft.

8. The automatic code reading device as claimed in claim 2, which further comprises said object taking means being reciprocatably mounted in said chamber, means for actuating said holding means at a time when said taking means is at the most retracted position thereof in said chamber, and means for actuating said rotating means at a time when said taking means arrives the most retracted position thereof.

9. An automatic code reading device for reading out a code mark affixed on an axial end surface of an object having a circular section, which comprises:
a housing defining a chamber in which the object should be loaded;
means for holding the object within said chamber, said holding means including a pair of shaft means axially slidably and rotatably supported through opposite side walls of said housing, plate means secured to inner ends of said respective shaft means, and means for urging said shaft means inwardly to hold the object between said plate means;
means for reading out the code mark and fixedly disposed in said chamber to face the object contained in said chamber; and
motor means for rotating at least one of said pair of shaft means to rotate the object held by said holding means around the axis thereof to scan the code mark without failure.

10. The automatic code reading device as claimed in claim 9, which further comprises means for taking the object into said chamber.

11. The automatic code reading device as claimed in claim 9, which further comprises a motor control circuit for controlling the operation of said motor means to rotate said shaft over an angular extent of $(360° + \alpha°)$, where $\alpha°$ is at least an angular extent over which the code mark extends.

12. The automatic code reading device as claimed in claim 9, which further comprises means for taking the object into said chamber and being reciprocatably mounted in said chamber, and means for actuating said urging means at a time when said taking means is at the most retracted position.

13. The automatic code reading device as claimed in claim 11, which further comprises means for taking the object into said chamber and being reciprocatably mounted in said chamber, and means for applying a starting signal to said motor control circuit at a time when said taking means arrives the most retracted position thereof.

14. An automatic code reading device for reading out a code mark affixed on an axial end surface of an object of a circular section having a center hole, which comprises:
a housing defining a chamber in which the object should be loaded;
means for holding the object at the edge of the center hole of the object in said chamber, said holding means comprising shaft means axially slidably and rotatably supported through a side wall of said housing, at least two equiangularly spaced arm means radially extending from and radially slidably mounted on the inner end of said shaft means, means for engaging with the edge of the center hole of the object and secured at the radial outer end of said each arm means, means for axially moving said shaft means to position said arm means in the center hole of said object contained in said chamber, and means for urging said arm means radially outwardly to engage said engaging means with the edge of the center hole of said object thereby to hold the object;
means for reading out the code mark and fixedly disposed in said chamber to face the object contained in said chamber; and
motor means for rotating said shaft means to rotate the object held by said holding means around the axis thereof to scan the code mark without failure.

15. The automatic code reading device as claimed in claim 14, which further comprises means for taking the object into said chamber.

16. The automatic code reading device as claimed in claim 14, which further comprises said shaft means being a hollow shaft, at least two equiangularly spaced sleeve portions radially extending from the inner end of said hollow shaft means, said arm means axially fitted into said respective sleeve portions and having said engaging means at the outer ends thereof, each of said arm means being formed with an inclined end surface at the inner end, rod means axially slidably disposed in said hollow shaft means and formed with surface areas which are consisting with, and engage with, said inclined end surfaces of said arm means, and means for axially moving said rod means to axially project said arm means due to the sliding engagement between said inclined end surfaces and said surface areas.

17. The automatic code reading device as claimed in claim 14, which further comprises a motor control circuit for controlling the operation of said motor means to rotate said shaft means over an angular extent of $(360° + \alpha°)$, where $\alpha°$ is at least an angular extent over which the code mark extends.

18. The automatic code reading device as claimed in claim 14, which further comprises means for taking the object into said chamber and being reciprocatably mounted in said chamber, means for actuating said shaft moving means at a time when said taking means is at the most retracted position, and means for actuating said arm urging means after said shaft moving means is actuated.

19. The automatic code reading device as claimed in claim 18, which further comprises a motor control circuit for controlling the operation of said motor means to rotate said shaft means over an angular extent of (360°+α°), where α° is an angular extent over which the code mark extends, and means for applying a starting signal to said motor control circuit after said arm urging means is actuated.

20. In an object transferring device used in an apparatus for automatically storing objects to storage locations, each of said objects having a circular section and having a code mark affixed on an axial end surface thereof, the improvement which comprises:
 a housing defining a chamber in which the object should be loaded;
 means for stationarily holding the object within said chamber;
 means for reading out the code mark and disposed in said chamber to face the object contained in said chamber; and
 means for rotating said reading means around the axis of the object contained in said chamber to scan the code mark on the axial end surface of the object without failure, said rotating means comprises a shaft rotatably supported through and by said housing, motor means for rotating said shaft and mounted on said housing, a lever arm being pivoted on the inner end of said shaft and being provided with said reading means mounted on an end thereof, roller means mounted on said lever arm near said reading means, and tension spring means connected between the other end of said lever arm and said shaft to urge said roller means to the axial end surface of the object contained in said chamber.

21. The improvement as claimed in claim 20, which further comprises means for pushing said other end of said lever arm against said tension spring means for permitting the object to be smoothly drawn into and discharged from said chamber without the engagement with said reading means and said roller means.

22. The improvement as claimed in claim 21, which further comprises a motor control circuit for controlling said motor means to rotate said reading means over a predetermined angular extent of (360°+α°) and to reversely rotate, thereafter, to return said reading means to the initial angular position, where α° is at least an angular extent over which the code mark extends on the axial end surface of the object.

23. The improvement as claimed in claim 22, which further comprises first angular sensing means for sensing the initial angular position of said reading means, second angular sensing means for sensing a rotational angular position of α° of said reading means from the initial angular position, and said motor control circuit reversing the rotation of said motor means at a time when an output signal from said second angular sensing means is twice input and, thereafter, stopping said motor means at a time when an output signal from said first angular sensing means is input.

24. The improvement as claimed in claim 23, which comprises first and second photo-switch units each comprising a light source and a photo-cell and fixedly mounted on said housing, and a common shutter means secured to said shaft to cross between said light source and said photo-cell during the rotation of said shaft.

25. The improvement as claimed in claim 20, which further comprises said shaft being a hollow shaft, said lever arm being a hollow lever, cable means connected to said reading means and led out through said hollow lever and said hollow shaft.

26. In an object transferring device used in an apparatus for automatically storing objects to storage locations, each of said objects having a circular section and having a code mark affixed on an axial end surface thereof, the improvement which comprises:
 a housing defining a chamber in which the object should be loaded;
 means for holding the object within said chamber, said holding means comprising a pair of shaft means axially slidably and rotatably supported through opposite side walls of said housing, plate means secured to inner ends of said respective shaft means, and means for urging said shaft means inwardly to hold the object between said plate means;
 means for reading out the code mark and fixedly disposed in said chamber to face the object contained in said chamber; and
 motor means for rotating at least one of said pair of shaft means to rotate the object held by said holding means around the axis thereof to scan the code mark without failure.

27. The improvement as claimed in claim 26, which further comprises a motor control circuit for controlling the operation of said motor means to rotate said shaft over an angular extent of (360°+α°), where α° is at least an angular extent over which the code mark extends.

28. The improvement as claimed in claim 26, which further comprises means for extracting the object into said chamber and being reciprocatably mounted in said chamber, and means for actuating said urging means at a time when said extracting means is at the most retracted position.

29. In an object transferring device used in an apparatus for automatically storing objects to storage locations, each of said objects having a circular section and having a code mark affixed on an axial end surface thereof, the improvement which comprises:
 a housing defining a chamber in which the object should be loaded;
 means for holding the object at the edge of the center hole of the object in said chamber, said holding means comprising shaft means axially slidably and rotatably supported through a side wall of said housing, at least two equiangularly spaced arm means radially extending from and radially slidably mounted on the inner end of said shaft means, means for engaging with the edge of the center hole of the object and secured at the radial outer end of said each arm means, means for axially moving said shaft means to position said arm means in the center hole of said object contained in said chamber, and means for urging said arm means radially outwardly to engage said engaging means with the edge of the center hole of said object thereby to hold the object;
 means for reading out the code mark and fixedly disposed in said chamber to face the object contained in said chamber; and motor means for rotating said shaft means to rotate the object held by said holding means around the axis thereof to scan the code mark without failure.

30. The improvement as claimed in claim 29, which further comprises said shaft means being a hollow shaft, at least two equiangularly spaced sleeve portions radially extending from the inner end of said hollow shaft means, said arm means axially fitted into said respective sleeve portions and having said engaging means at the outer ends thereof, each of said arm means being formed with an inclined end surface at inner end, rod means and formed with surface areas which are consisting with, and engage with, said inclined end surfaces of said arm means, and means for axially moving said rod means to axially project said arm means due to the sliding engagement between said surface areas.

31. The improvement as claimed in claim 29, which further comprises a motor control circuit for controlling the operation of said motor means to rotate said shaft means over an angular extent of $(360°+\alpha°)$, where $\alpha°$ is at least an angular extent over which the code mark extends.

32. The improvement as claimed in claim 29, which further comprises means for taking the object into said chamber and being reciprocatably mounted in said chamber, means for actuating said shaft moving means at a time when said taking means is at the most retracted position, and means for actuating said arm urging means after said shaft moving means is actuated.

* * * * *